United States Patent [19]

Kojima et al.

[11] Patent Number: 5,516,611

[45] Date of Patent: May 14, 1996

[54] LIGHT-RECEIVING MEMBER AND METHODS OF PRODUCING LIGHT-RECEIVING MEMBER

[75] Inventors: Satoshi Kojima, Kyoto; Hirokazu Ohtoshi, Nara; Hitoshi Murayama, Kyoto, all of Japan

[73] Assignee: Canon Kabushiki Kaisha, Tokyo, Japan

[21] Appl. No.: 224,730

[22] Filed: Apr. 8, 1994

[30] Foreign Application Priority Data

Apr. 9, 1993 [JP] Japan ................ 5-105978

[51] Int. Cl.⁶ ............................ G03G 5/085
[52] U.S. Cl. ........................... 430/84; 430/95
[58] Field of Search ................. 430/58, 63, 65, 430/84, 95

[56] References Cited

U.S. PATENT DOCUMENTS

| | | | |
|---|---|---|---|
| 4,265,991 | 5/1981 | Hirai et al. | 430/64 |
| 4,471,042 | 9/1984 | Komatsu et al. | 430/64 |
| 4,871,632 | 10/1989 | Iino et al. | 430/58 |
| 4,954,397 | 9/1990 | Amada et al. | 430/58 |

Primary Examiner—John Goodrow
Attorney, Agent, or Firm—Fitzpatrick, Cella, Harper & Scinto

[57] ABSTRACT

In order to improve characteristics of a light-receiving member for electrophotography having a photoconductive layer comprising an amorphous silicon material and implement a method for facilitating designing of a layer structure, the present invention provides a light-receiving member which is formed by depositing in sequence a photoconductive layer which comprises a non-monocrystalline material comprising silicon atoms as a main element and a surface layer on a conductive substrate, wherein the photoconductive layer comprises at least hydrogenated amorphous silicon which contains at least carbon atoms and boron atoms and the boron atom content in the photoconductive layer in a direction of film thickness is varied in a correlation of exponential functions with respect to the carbon atom content in the photoconductive layer in the direction of film thickness, and a method for producing the light-receiving member by forming a layer while controlling a charge of a starting gas for the boron atoms in the correlation of exponential functions with respect to a charge of a starting gas for the carbon atoms.

13 Claims, 6 Drawing Sheets

F I G. 1
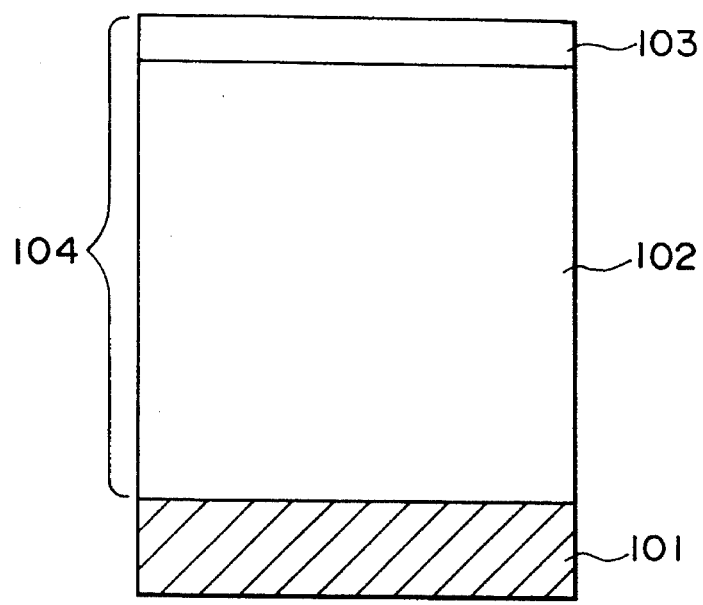
F I G. 2
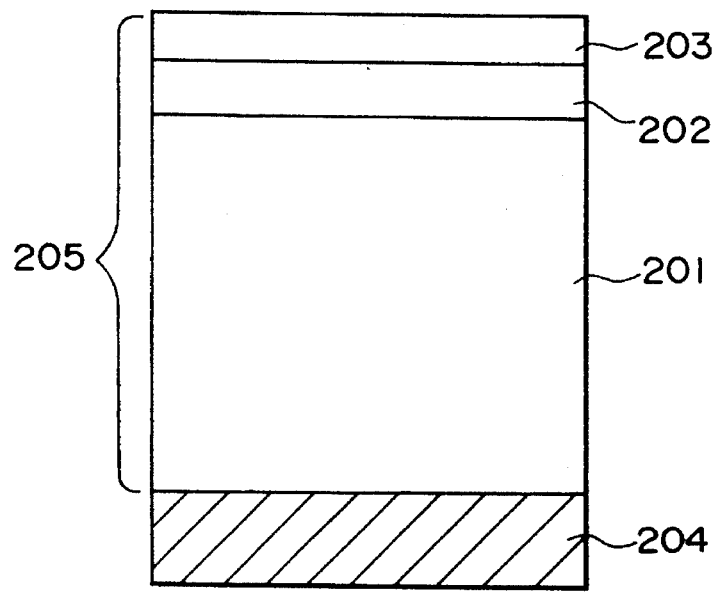

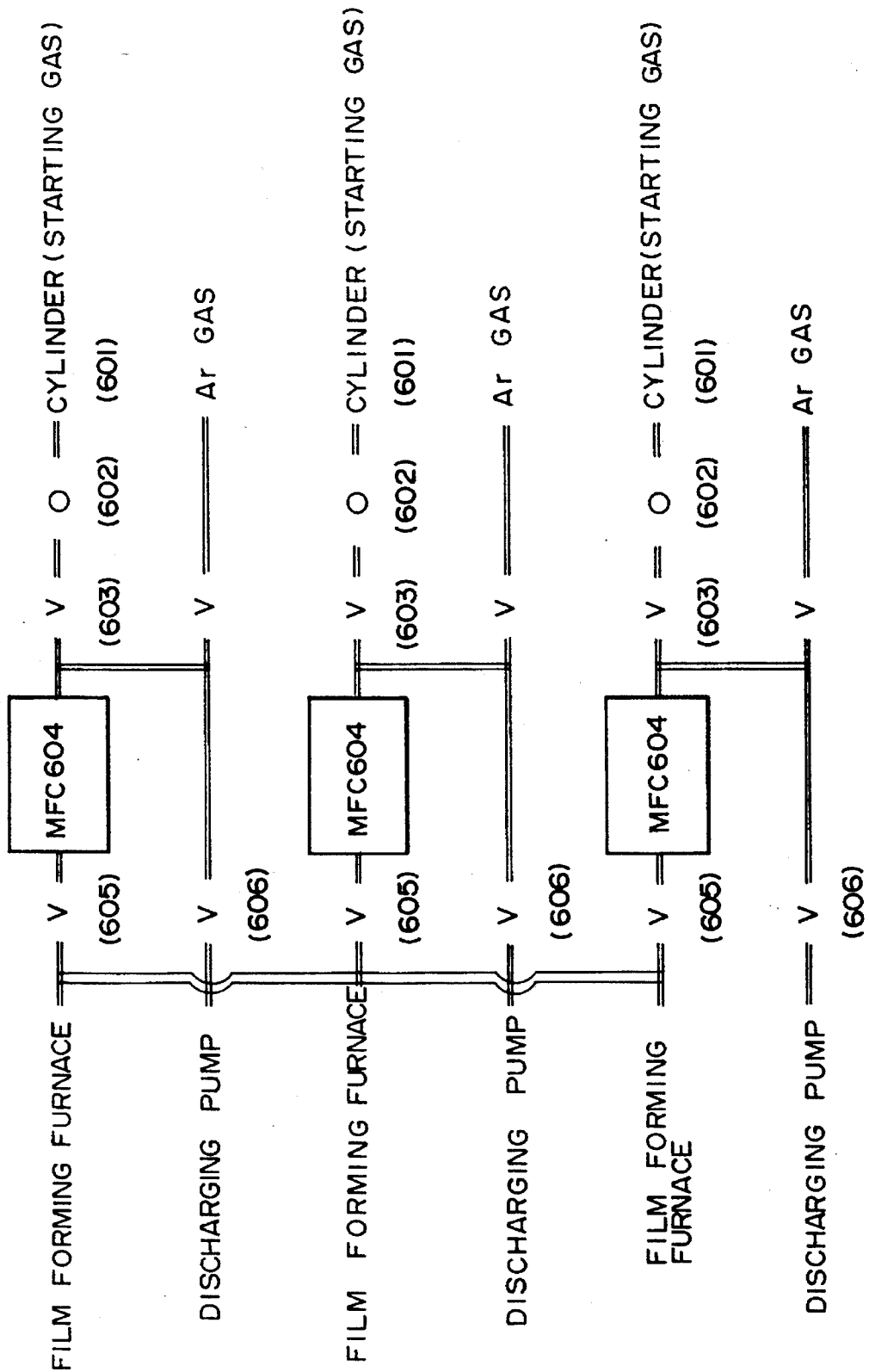

LIGHT-RECEIVING MEMBER AND METHODS OF PRODUCING LIGHT-RECEIVING MEMBER

BACKGROUND OF THE INVENTION

1. Field of the Invention

The present invention relates to a light-receiving member which has a sensitivity to electromagnetic waves such as light (hereafter light is defined in the broad sense of the word and includes ultraviolet rays, visible rays, infrared rays, X rays, λ rays, etc.), more specifically, a light-receiving member which is important in the field of image formation by an electrophotographic copying machine or the like and a method of producing the light-receiving member.

2. Related Background Art

In the field of image formation, a photoconductive material which forms a light receiving layer in a light-receiving member is required to provide a high sensitivity, a high S/N ratio [optical current (Ip)/dark current (Id)], an absorption spectrum adapted to spectral characteristics of irradiated electromagnetic waves, quick response to light, and required dark resistance and is harmless to human bodies during use. Particularly, for a light-receiving member for electrophotography to be incorporated in electrophotographic copiers to be employed at offices as office equipment, pollution-free harmlessness is an important point.

Amorphous silicon (hereafter referred to as "a-Si") is a photoconductive material which has been lately noted afresh from the viewpoint as described above and an application of amorphous silicon as a light-receiving member for electrophotography has been disclosed, for example, in U.S. Pat. No. 4,265,991.

FIG. 1 schematically shows an example of a layer structure of a light receiving layer 104 for electrophotography wherein 101 is a conductive substrate, 102 is a light receiving layer made of a-Si and 103 is a surface protective layer. This light-receiving member for electrophotography is generally made by heating a conductive substrate 101 to 50° to 400° C. and depositing a light receiving layer 102 made of a-Si on the conductive substrate by a film forming method such as a vacuum depositing method, a sputtering method, an ion plating method, a thermal CVD method, an optical CVD method and a plasma CVD method. Particularly, the plasma CVD method, that is, a method for decomposing starting gases through glow discharging with a direct current, a high frequency of microwaves and forming an a-Si deposited film on the conductive substrate, has been implemented as an appropriate method.

On the other hand, amorphous silicon carbide (hereafter referred to as "a-SiC") is known for its high thermal resistance and surface hardness, higher dark resistance than a-Si and possible variations of an optical band gap in a range of 1.6 to 2.8 eV in accordance with the content of carbon. A light-receiving member for electrophotography whose photoconductive layer is formed with such a-SiC has been proposed in U.S. Pat. No. 4,471,042. This patent has disclosed that excellent electrophotographic characteristics including high dark resistance and high optical sensitivity could be obtained by using an a-Si, which contains 0.1 to 30 atomic % of carbon as a chemically modified substance, as a photoconductive layer for the light-receiving member for electrophotography.

Though a conventional photoconductive light-receiving member for electrophotography made of a-Si material has been improved in such characteristics as dark resistance, sensitivity, electrical, optical and photoconductive characteristics, environmental conservation, aging stability and durability, there is in fact still room for further improvement of general characteristics along with those demands for higher sensitivity and durability.

For designing a photoconductive member with the a-Si material, another improvement is required so that the desired characteristics as described above may be obtained.

Designing of a layer structure containing carbon atoms for a photoconductive member enables one to obtain a photoconductive member which excels in the charge maintaining performance in charge treatment, reduces an influence of residual potential on formation of images, provides stable electrical characteristics, high sensitivity and high S/N ratio even in a highly moist atmosphere, and also obtain high quality visible images with clear half tone and high resolution which excel in light-proof fatigue and repeatability and has a high hardness.

However, the content of boron atoms varies along with variations of the content of the carbon atom content in reference to the silicon atom content and therefore actual designing of the layer structure has been very difficult. Hence the light-receiving member for electrophotography has been produced and the determination on a layer structure and designing of the layer structure have been experimentally conducted by evaluating its electrophotographic characteristics.

However, it has been demanded to make it possible to design the layer structure by a simple method for improvement of general characteristics and reduction of overall costs and the period of development.

SUMMARY OF THE INVENTION

An object of the present invention is to provide a method for saving labor and time through experimental fabrication of the layer structure as conventional by controlling variations of the content of carbon atoms and boron atoms in reference to variations of the content of silicon atoms in the light-receiving member having a photoconductive layer made of hydrogenated amorphous silicon containing carbon and boron atoms and easily carrying out a desired design of a layer structure, and a light-receiving member with excellent characteristics by the method.

Specifically, the object of the present invention is to provide a light-receiving member for electrophotography which excels in electrical and optical characteristics such as a dark resistance value, high sensitivity and optical response, photoconductive characteristics, environmental conserving characteristic, aging stability, and durability and further provides more excellent charge maintaining performance particularly in charge treatment than conventionally obtained with less effect of residual potential on formation of images, stable electrical characteristics, high sensitivity and high S/N ratio even in a highly moist atmosphere for the light-receiving member made of an a-Si material for electrophotography which has a photoconductivity by facilitating the design of the layer structure and permits one to obtain high quality visible images which excel in the light-proof fatigue and repeatability and provide high hardness, clear half tone and high resolution by designing a layer structure of the photoconductive member containing carbon atoms.

Another object of the present invention is to provide a light-receiving member which is made up by depositing in sequence a photoconductive layer having a non-monocrystalline material comprising silicon atoms as a base and a surface layer on a substrate having at least a conductive surface, wherein the photoconductive layer comprises a hydrogenated amorphous silicon containing at least carbon and boron atoms and maintains a correlation of the carbon atom content ($X_1$) and the boron atom content ($Y_1$) in the direction of film thickness in the photoconductive layer as an exponential function correlation.

A further another object of the present invention is to provide a light-receiving member for which the exponential function correlation is as given below:

$$Y_1 = \text{EXP}\left[\frac{X_1 + B}{A}\right] \quad (1)$$

where A and B are constants.

A further object of the present invention is to provide a light-receiving member for which the constants A and B of the above equation are A=6.2±0.5 and B=−5.4±0.9.

Another object of the present invention is to provide a method for producing a light-receiving member which comprises forming a film by controlling a quantity of a starting gas for the above-described boron atoms to be introduced into the film forming chamber so that the quantity of the starting gas for boron atoms may have an exponential function correlation for the charge of starting gas for carbon atoms in the CVD method as a method for producing the light-receiving member.

A still further another object of the present invention is to provide a method for producing a light-receiving member for forming a film by controlling the quantity of gas so that the above exponential function correlation may be as given below:

$$Y_2 = \text{EXP}\left[\frac{X_2 + D}{C}\right] \quad (2)$$

where x is the charge of starting gas for carbon atoms, Y is the charge of starting gas for boron atoms, and C and D are constants.

BRIEF DESCRIPTION OF THE DRAWINGS

FIG. 1 is a schematic sectional view showing an example of a light-receiving member according to the present invention;

FIG. 2 is a schematic sectional view showing an example of a light-receiving member used in an experiment according to the present invention;

FIG. 7 is a typical diagram showing starting gas charge control means for use in Examples according to the present invention.

DETAILED DESCRIPTION OF THE PREFERRED EMBODIMENTS

Figure 3:
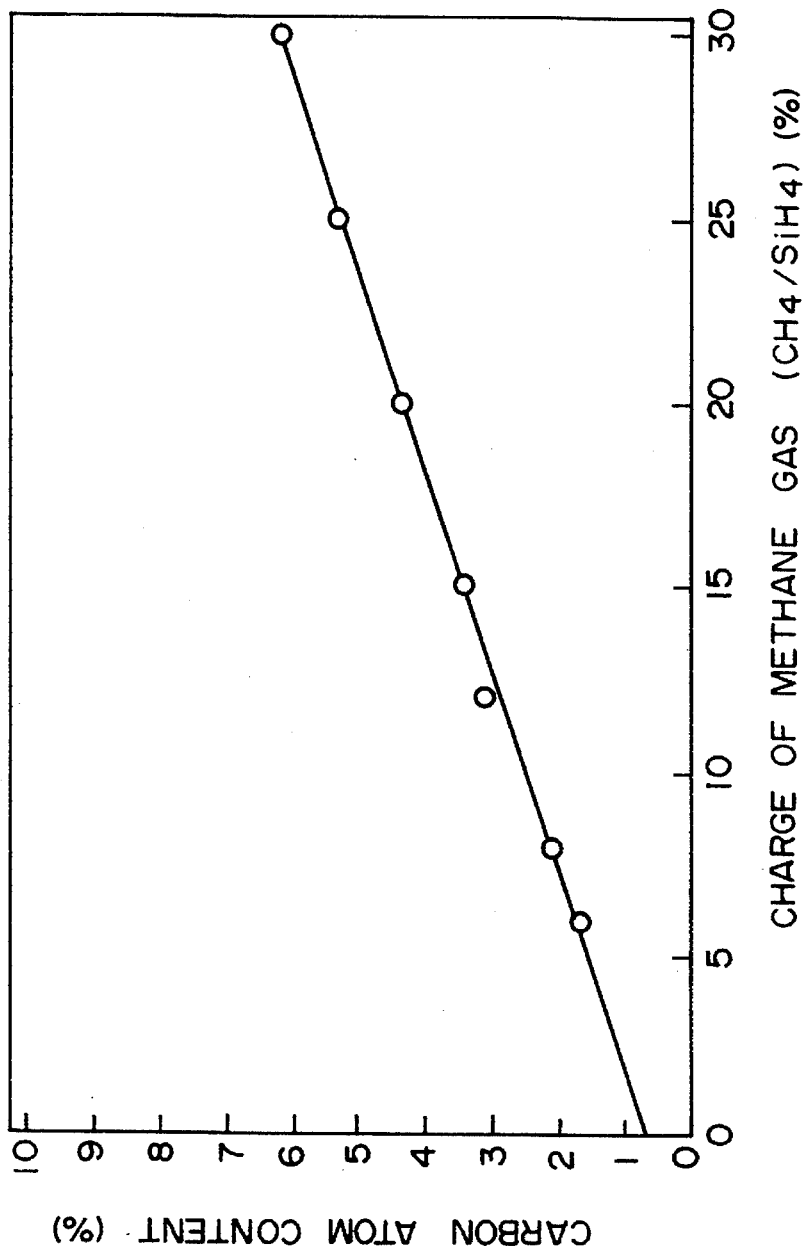
FIG. 3 is a graph of a correlation between a charge of methane gas and a carbon atom content.

The present invention intended to solve the above problems and implement the above-described objects is based on the finding that a relationship between the carbon atom content (X) and the boron atom content (Y) in the direction of film thickness in a photoconductive layer is an exponential function correlation.

Particularly the present invention is based on the finding that, in the case that hydrogenated amorphous silicon which contains silicon atoms as the main component and carbon and boron atoms is used as a light-receiving member for which the above-described exponential function correlation is as given below, labor and time in experiments can be saved better than in a conventional method for determining the carbon atom content and the boron atom content by evaluating the characteristics of samples experimentally produced:

$$Y_1 = \text{EXP}\left[\frac{X_1 + B}{A}\right] \quad (1)$$

where A and B are constants.

The present invention is based on the finding that the above objects can be achieved when the above-described exponential function correlation in the case of hydrogenated amorphous silicon containing oxygen atoms and fluorine atoms in the photoconductive layer is as given below:

$$Y_1 = \text{EXP}\left[\frac{X_1 - F}{E}\right] \quad (3)$$

where E and F are constants.

Designing of an ideal layer structure can be easily and implemented with certainty calculating a quantity (charge) of starting gas for the boron atoms to be introduced into a film forming chamber for a charge of starting gas for the carbon atoms from equations (1) or (2) and forming the film while controlling the charge of the starting gas for boron atoms to the value obtained from the above calculation.

Carbon atoms and boron atoms to be contained in the photoconductive layer are preferably contained in a part as large as 80% or more of the overall thickness of the photoconductive layer and, in this case, the carbon atom content is preferably 0.005 atomic % to 20 atomic % and more preferably 0.005 atomic % to 15 atomic % and the boron atom content is preferably 0.01 atomic ppm to 15 atomic ppm and more preferably 0.01 atomic ppm to 12 atomic ppm, with reference to silicon atoms.

In addition, in the case that oxygen atoms and fluorine atoms are contained in the photoconductive layer, an oxygen atom content for silicon atoms is preferably 0.001 atomic ppm to 10 atomic % and more preferably 0.001 atomic ppm to 1 atomic % and a fluorine atom content for silicon atoms is preferably 0.005 atomic ppm to 10 atomic % and more preferably 0.005 atomic ppm to 1 atomic %.

Moreover, a hydrogen atom content for silicon atoms is preferably 1 atomic % to 40 atomic %, more preferably 5 atomic % to 30 atomic % and further more preferably 8 atomic % to 28 atomic %.

It is preferable that carbon atoms or boron atoms are contained in an uneven density distribution in the direction of layer thickness and it is particularly preferable that the density of carbon atoms is high at the substrate side and/or the surface side.

Oxygen atoms or fluorine atoms can be contained evenly or unevenly in the photoconductive layer. Adhesiveness of the substrate and adjacent layers can be improved by particularly incorporating oxygen atoms in the photoconductive layer so that the density of oxygen atoms contained therein is higher at the substrate side and/or the surface side.

Though the thickness of the photoconductive layer is not limited if desired characteristics can be obtained, the thickness of the photoconductive layer used as a light-receiving member for electrophotography is preferably 5 μm to 100 μm and more preferably 10 μm to 80 μm.

Examples according to the present invention are described in detail, referring to the experiments described below.

Experiment 1

To attain the above objects, it is necessary to obtain a correlation between the carbon atom content and the boron atom content in the photoconductive layer. For this purpose, a light-receiving member having a layer structure as shown in FIG. 2 was made and an experiment was conducted to obtain the above-described correlation with which transitivities of electric charges in the light-receiving member are equal when the carbon atom content and the boron atom content in the photoconductive layer 201 are changed.

In FIG. 2, 204 is a conductive substrate, 201 is a photoconductive layer, 202 is a non-doped photoconductive layer, 203 is a surface protective layer and 205 is a light-receiving layer consisting of the above layers.

In this experiment 1, methane gas was used as the starting gas for carbon atoms and diborane gas as the starting gas for boron atoms and respective atoms were introduced into the photoconductive layer.

Figure 4:
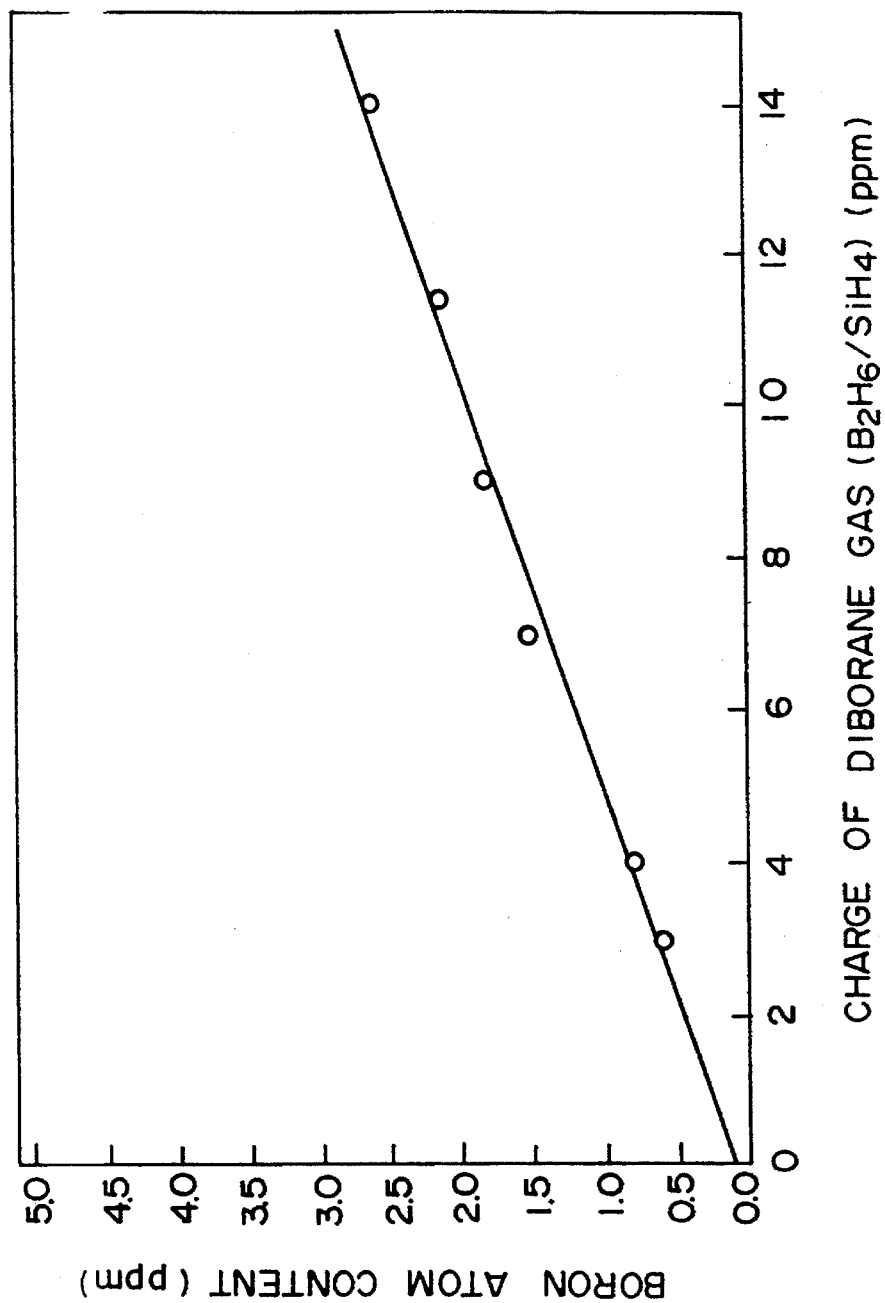
FIG. 4 is a graph of a correlation between a charge of diborane gas and a boron atom content.

FIG. 3 shows a correlation of the carbon atom content in the film to the charge of methane gas and FIG. 4 shows a correlation of the boron atom content in the film to the charge of diborane gas. In the correlation with which the transitivities of the charge are equal, the film has a higher resistance along with an increase of the carbon atom content in the film. The increase of the carbon atom content means that the structure transforms from Si:H to SiC:H. Therefore, an optical band gap becomes larger to provide a higher resistance and the transitivity of the charge become worse. Then the Fermi energy is changed so that activated energies are equal by doping boron atoms. Thus, a light-receiving member for electrophotography in which the transitivities of the charge are equal can be produced. The transitivity was evaluated by the T.O.F (Time Of Flight) method. The light-receiving member was produced so that the transitivity of the hole is within the range of approximately 0.7 to $1.3 \times 10^{-3}$ cm$^2$/V.s.

As known from FIGS. 3 and 4, the carbon or boron atom content in the film for the charge of starting gas is given in a proportional correlation. Accordingly, it is known that the carbon atom content and the boron atom content in the film can be changed in the exponential function correlation by adjusting the charge, for example, the charge of gas to obtain the exponential function correlation for forming the film.

Particularly, when the composition of the light-receiving member with excellent characteristics is analyzed by using the SIMS or the like, a correlation between the atomic % ($X_1$) of carbon atoms and the atomic ppm ($Y_1$) to be contained is as given below;

$$Y_1 = \mathrm{EXP}\left[\frac{X_1 + B}{A}\right] \quad (1)$$

where A and B are constants. A=6.2±0.5 and B=−5.4±0.9 were obtained from the light-receiving member produced by the present apparatus.

Accordingly, if the light-receiving member is produced as given by the equation (1), a light-receiving member with excellent characteristics can be certainly obtained even without production of the sample.

As a method for producing the light-receiving member according to the present invention, the film can be formed which contains the boron atoms and the carbon atoms in the photoconductive layer of the light-receiving member so that the correlation between these carbon and boron atoms conforms to the above equation (1) by changing the charge of starting gas for boron atoms such as diborane gas in terms of exponential function as shown in the equation (2) for the starting gas for carbon atoms such as methane gas, thereby enabling to provide the light-receiving member for electrophotography which satisfies the eletrophotographic characteristics.

Specifically, for producing a light-receiving member which has a photoconductive layer having hydrogenated amorphous silicon which contains carbon atoms and boron atoms by the CVD method, the film layer is formed so that the charge of starting gas for the boron atoms has the exponential function correlation as given below to the charge of starting gas for the carbon atoms:

$$Y_2 = \mathrm{EXP}\left[\frac{X_2 + D}{C}\right] \quad (2)$$

where $X_2$ is the charge of starting gas for the carbon atoms, $Y_2$ is the charge of starting gas for the boron atoms, and C and D are constants.

For producing the light-receiving member by the present apparatus (CVD apparatus), it is appropriate to determine the above C as 36±3 and D as 29±7.

$X_1$, $X_2$, $Y_1$ and $Y_2$ of the above equations (1) and (2) are treated as abstract numbers. For example, a value $Y_1$ obtained by substituting a numerical value of the carbon atom content (atomic %) for $X_1$ as an abstract number can be a numerical value of the boron atom content (atomic ppm). The above equation (2) is obtained from experimental values from a mean value or a variance of the results of a number of experiments conducted.

In addition, to obtain a desired dark resistance value and charge characteristics or an improved adhesiveness, the present invention permits one to include oxygen atoms and fluorine atoms in the light-receiving member and, in this case, it is necessary to derive an equation of relation as described above. The details are described later.

Embodiment

An embodiment according to the present invention is described below for actually producing a light-receiving member for electrophotography.

Materials for a conductive substrate for use in the present invention include, for example, metals such as Ni, Cr, stainless steel, Al, Mo, Au, Nb, Ta, V, Ti, Pt, Pb and Fe or alloys of these metals. Particularly, aluminum is preferable for use in the present invention in the points of manufacturing and handling for its appropriate strength and workability. For using aluminum as conductive substrates, it is preferable to contain magnesium of 1 to 10 weight % to raise cutting workability. In addition, an appropriate purity of aluminum before magnesium is contained is preferably 98 weight % or more and more preferably 99 weight % or more.

The conductive substrate can be formed as required, for example, in the shape of cylinder, belt and plate in accordance with applications or requests. For example, when using the light-receiving member 104 shown in FIG. 1 as a image forming member for electrophotography, it is preferably formed as an endless belt or a cylinder for continuous high speed copying.

Though the thickness of the conductive substrate is determined as required so that a light-receiving member as desired can be formed, the thickness of the conductive substrate can be minimized as far as the functions of the conductive substrate can be fully exhibited if the light-receiving member is demanded to be flexible. However, a preferable thickness is generally 10 μm or more for the reasons as to manufacturing and handling of the conductive substrate and its mechanical strength.

The light-receiving member according to the present invention is produced by an RF discharging method, a microwave discharging method or the like.

A plasma CVD method such as the RF discharging method and the microwave discharging method can be effectively used by introducing a gas containing silicon atoms such as silane ($SiH_4$) and silicon tetrafluoride ($SiF_4$) and/or a gas containing carbon atoms such as methane ($CH_4$), ethylene ($C_2H_4$) and acetylene ($C_2H_2$) and a dopant gas containing boron atoms such as diborane ($B_2H_6$) and boron fluoride ($BF_3$).

In the case of the microwave discharging method, the effect of control can be more improved in conjunction with the above-described method by forming an electric field in a discharging space to make ions effectively reach the surface of the conductive substrate.

In the present invention, hydrogen ($H_2$), argon (Ar), helium (He) and the like can be used as a diluent gas for forming a photoconductive layer. A starting gas containing oxygen atoms such as carbon monoxide (CO), carbon dioxide ($CO_2$) and the like, and a gas containing fluorine atoms such as silicon tetrafluoride ($SiF_4$) and the like can also be used. Otherwise, the present invention can be similarly made effective by simultaneously introducing mixture gases of starting gases selected from the above-described starting gases into the film forming chamber.

An optimum range of temperature of the conductive substrate for forming the photoconductive layer according to the present invention is selected as required in accordance with the photoconductive layer forming method and formation of the photoconductive layer is executed. Generally, the temperature of the conductive substrate is preferably 50 to 350 degrees and more preferably 100 to 300 degrees.

The RF glow discharging method and the microwave plasma CVD method can be advantageously used for forming the photoconductive layer since a delicate control of a composition ratio of atoms constituting the layer and a control of the layer thickness are relatively easy as compared with other methods. For forming the photoconductive layer by these layer forming methods, a discharging power and a gas pressure during formation of the layer as well as the temperature of the conductive substrate are important factors which determine the characteristics of the light-receiving member to be produced.

It is preferable that the discharging power requirement for effectively producing the light-receiving members according to the present invention in high productivity is generally 10 to 5000 W, more preferably 20 to 2000 W per one conductive substrate. For the microwave discharging method, it is preferable that the internal pressure of the film forming chamber is generally 0.2 mTorr to 100 mTorr, more preferably 1 mTorr to 50 mTorr.

Producing Method

The following describes a method for producing a photoconductive member to be formed by the microwave plasma CVD method used in the present invention.

Figure 5:
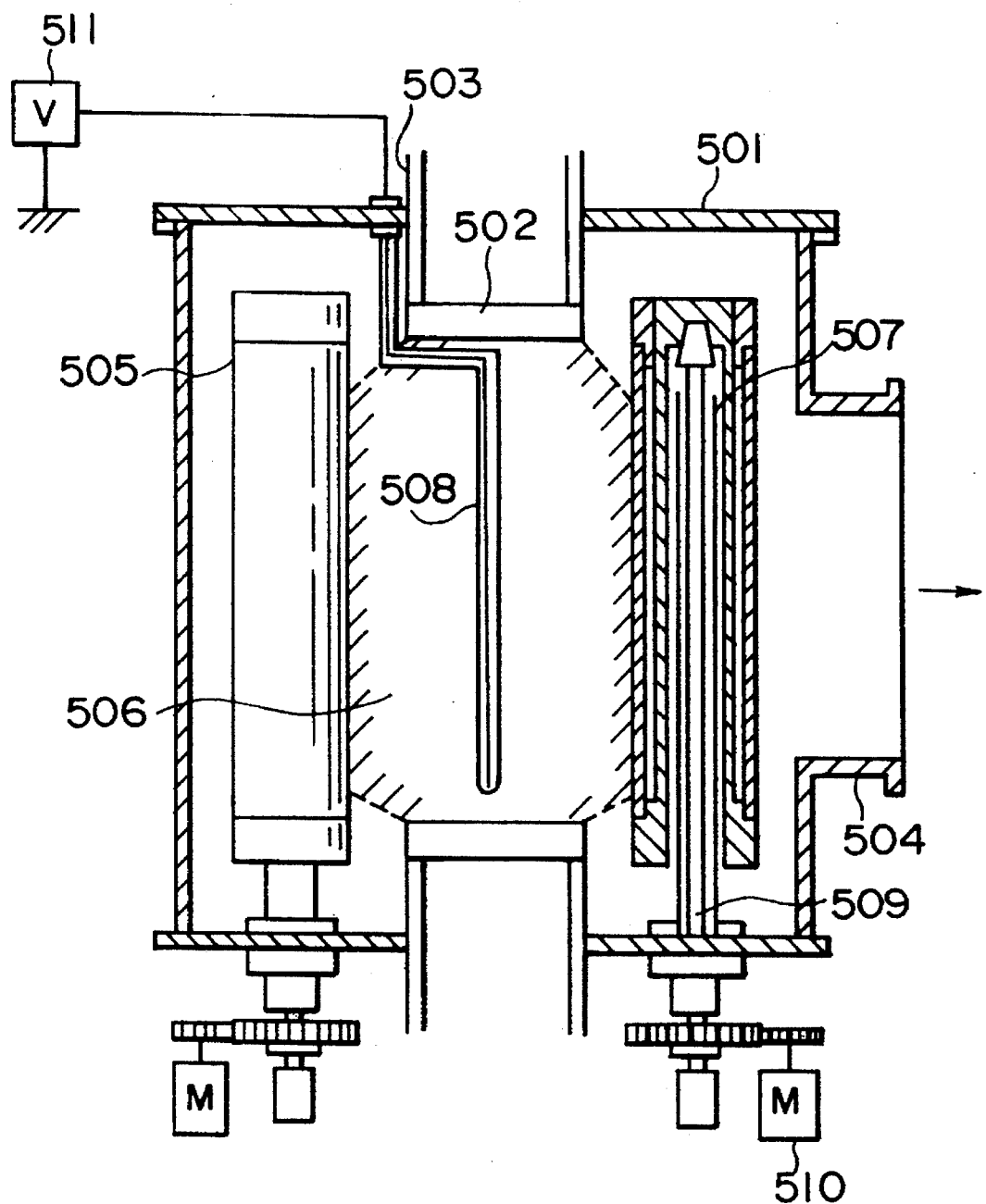
FIG. 5 is a schematic vertical sectional view of an apparatus for producing a light-receiving member by a microwave discharging method according to the present invention.
Figure 6:
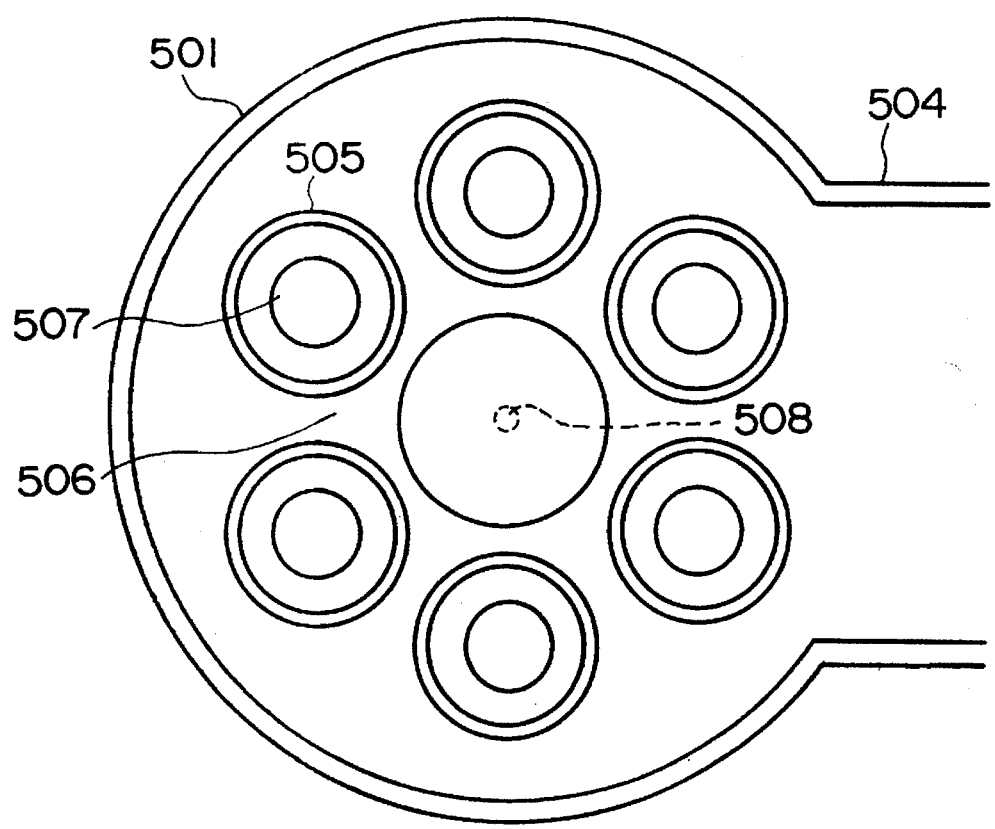
FIG. 6 is a schematic transverse sectional view of an apparatus for producing a light-receiving member by a microwave discharging method according to the present invention.

FIGS. 5 and 6 respectively show an example of an apparatus for producing the light-receiving member for electrophotography according to the microwave plasma CVD method using a cylindrical conductive substrate. FIG. 5 is a schematic elevation of the apparatus and FIG. 6 is a schematic plan view of the apparatus.

In FIGS. 5 and 6, 501 is a reactor which forms a vacuum-tight structure. 502 is a microwave introducing dielectric window which is formed from a material which is able to efficiently transmit a microwave power into the reactor 501 and maintain vacuum tightness (for example, quartz glass, alumina ceramics or the like). 503 is a waveguide for transmitting the microwave power and comprises a square part from the microwave power source to a position near the reactor and a cylindrical part inserted into the reactor. The waveguide 503 together with a stub tuner (not shown in the drawings) and an isolator (not shown in the drawings) are connected to the microwave power supply (not shown in the drawings). The dielectric window 502 is air-tightly sealed to the partial cylindrical inside wall of the waveguide 503 to maintain the atmosphere in the reactor. 504 is an exhaust pipe which is open to the reactor 501 at its one end and communicated with a gas discharging unit (not shown in the drawings) at its other end. 506 shows a discharging space surrounded by the conductive substrates 505. A power supply 511 is a power supply (bias power supply) for applying a voltage to a gas introducing pipe which also serves as a bias electrode 508 and electrically connected to the electrode 508.

The light-receiving member for electrophotography is produced as described below by using the apparatus for producing such light-receiving member for electrophotography.

The reactor 501 is evacuated by the vacuum pump (not shown in the drawings) through the exhaust pipe 504 and the internal pressure of the reactor 501 is adjusted to $1 \times 10^{-7}$ Torr or less.

The conductive substrate 505 is heated by the heater 507 to a specified temperature and maintained at this temperature. Then starting gases for the photoconductive layer are introduced into the reactor through gas introducing means not shown in the drawings. In other words, such starting gases as silane gas as the starting gas for a-Si (H, X), diborane gas as the doping gas and helium gas as the diluent gas are introduced into the reactor 501 through a gas introducing pipe/bias electrode 508.

In the present invention, the photoconductive layer is formed while precisely calculating the flow rates of gases to be introduced by a computer and mutually controlling each gas flow rates by a computer-controlled precision gas flow meter (Mass Flow Controller: MFC). FIG. 7 is a typical diagram showing the gas flow rate control means according to the present invention. As shown in FIG. 7, the gas introducing means is connected to a valve 603 through a gas cylinder 601 and a pressure controller 602 and further connected to the gas introducing pipe/bias electrode 508 through the valve 605 while the gas flow rates are controlled at all times by the precision gas flow rate meter 604 which is controlled by the computer. The starting gases can be introduced after the gas in the piping has been exhausted by a special exhaust pump through a valve 606 before introducing the starting gases.

Simultaneously in parallel with the above, a microwave of 2.45 GHz frequency is generated by a microwave power supply (not shown in the drawings) and introduced into the reactor 501 through the waveguide 503 and the dielectric window 502.

In addition, a DC voltage is applied from the power supply 511 electrically connected to the gas introducing pipe/bias electrode 508 in the discharging space 506 to the gas introducing pipe/bias electrode 508 for the conductive substrate 505.

In the discharging space 506 surrounded by the conductive substrates 505, starting gases are excited with a microwave energy and dissociated, and the photoconductive layer is formed on the surface of the conductive substrate 505 while constantly applying an ion impact from the electric field between the gas introducing pipe/bias electrode 508 and the conductive substrates 505 to the conductive substrate 505.

At this time, the rotary shaft 509 on which the conductive substrate 505 is set is rotated by the motor 510 and the conductive substrate 505 is rotated around the central axis in the direction of bus line of the conductive substrate whereby a deposited film layer is uniformly formed along the overall periphery of the conductive substrate 505.

Experiment 2

A light-receiving member having a blocking layer, a photoconductive layer and a surface layer was formed on an aluminum cylinder, which has been mirror-finished, by using the microwave plasma CVD apparatus shown in FIGS. 5 and 6 under the producing conditions as shown in Tables 1 and 2. The electrophotographic characteristics of the light-receiving member are shown in Table 3.

It is known from the results of the above experiment that sample A1 of the sample A series which does not contain carbon atoms shows excellent electrophotographic characteristics. The electrophotographic characteristics of respective samples which depend on the boron atom content were evaluated by changing the charged carbon content in reference to the sample A1 as a reference sample, and the carbon atom content which would provide the results equivalent to or better than the reference sample.

As the result, the best characteristics were obtained with carbon 0% and boron 0.5 ppm (sample A1), carbon 10% and boron 3.5 ppm (sample B2), carbon 20% and boron 7 ppm (sample C3), carbon 30% and boron 14 ppm (sample D2), and carbon 40% and boron 25 ppm (sample E2).

These light-receiving members were analyzed by the SIMS method. Thus the quantities of carbon atoms and boron atoms actually contained in the film layer were measured to obtain a correlation between these quantities and the charges. This correlation obtained is as shown in FIGS. 3 and 4.

As described above, it is known that there is a proportional relation between the charges of starting gases and actual atom contents. The relation of carbon atoms and boron atoms contained in this film layer is expressed by the above-described equation 1. However, the carbon atom content and also the boron atom content include a certain range of variations and therefore the actual atom contents have a correlation with a fixed width and not a correlation of one to one. However, this width tends to be larger as the carbon atom content increases.

Experiment 3

A blocking layer, a photoconductive layer and a surface layer as shown in Table 1 were deposited on an aluminum cylinder, which had been mirror-finished, by using the producing apparatus shown in FIGS. 5 and 6. In this case, samples 3A(1) to 3A(5) were made so that the carbon atom content in the photoconductive layer is as shown in Table 23. Respective boron quantities at that time were derived from the equation 1.

Samples 3B(1) to 3B(5) were made by adjusting the carbon atom content to be 10% and the boron atom content to be a value as shown in Table 23.

In addition to production of these drums, a hydrogenated amorphous silicon containing carbon was formed on a silicon wafer under the same conditions as for the photoconductive layer.

The light-receiving member thus produced was set on an electrophotographic unit (which is modified for this test from the NP6650 manufactured by CANON) and the electrophotographic characteristics such as the charge performance, sensitivity, residual potential, optical memory and image defect were evaluated.

A hydrogen content of the silicon wafer was measured by the FTIR (Fourier Transformation Infrared Spectrophotometer). The results of evaluations are shown in Table 24.

It is known from the results of evaluations that it is preferable that the carbon atom content is 0.005 to 20 atomic % and the boron atom content is 0.01 to 15 atomic ppm.

EXAMPLE 1

A photoconductive layer and a surface layer were deposited on an aluminum cylinder, which had been mirror-finished, by using the producing apparatus shown in FIGS. 5 and 6, and a photoconductive layer of hydrogenated amorphous silicon containing carbon was formed according to the equation 1 derived from the above-described experiment 1.

The carbon atom content was determined so as to decrease in terms of linear functions toward the surface side in the direction of film thickness. Therefore the photoconductive layer was produced so that the boron atom content was determined so as to decrease in terms of exponential functions according to the equation 1 (sample 1). Table 4 shows the producing conditions.

Comparative Example 1

For comparison, a photoconductive layer and a surface layer were deposited on an aluminum cylinder, which had been mirror-finished and the sample (sample 2) was produced by changing the boron atom content in terms of linear functions in accordance with the decrease of carbon atoms without following the equation 1 in the photoconductive layer in which the carbon atom content decreases in terms of linear functions toward the surface side as in the sample 1. Table 5 shows the producing conditions.

The light-receiving member thus produced was set on an electrophotographic unit (which is modified for this test from the NP6650 manufactured by CANON) and the electrophotographic characteristics such as the charge performance, sensitivity, residual potential, optical memory and image defect were evaluated.

The results of evaluations of the electrophotographic characteristics are shown in Table 6.

A photoconductive layer and a surface layer were deposited on an aluminum cylinder, which had been mirror-finished, by using the producing apparatus shown in FIGS. 5 and 6, and the light-receiving member was produced by determining respective boron atom contents according to the correlation given by the equation 1 in a case that carbon atoms are distributed so that the carbon atom content in the photoconductive layer increases toward the substrate side in the direction of film thickness, a case that carbon atoms are distributed so that the carbon atom content is constant in the direction film thickness and a case that carbon atoms are distributed so that the carbon atom content increases toward the surface in the direction of film thickness.

Tables 7 and 8 show the producing conditions. Table 8 shows in detail the percentages of $CH_4/SiH_4$ for respective samples.

The light-receiving member produced was evaluated in the same manner as in Example 1.

Table 9 shows the results of evaluations of the eletrophotographic characteristics.

EXAMPLE 2

When a photoconductive layer and a surface layer are deposited on an aluminum cylinder, which have been mirror-finished, by using the producing apparatus shown in FIGS. 5 and 6, the carbon atom content in the photoconductive layer decreases toward the surface in the direction of film thickness. In this case, if the boron atom content which decreases in terms of exponential functions according to the equation 1 is adjusted to be within the allowable range, the electrophotographic characteristics will not be adversely affected even though the correlation of the atom contents is determined by approximating the exponential function of the equation 1 with a one-folded straight line.

Table 10 shows the producing conditions for this example.

The light-receiving member produced was evaluated in the same manner as in the example 1.

Table 11 shows the results of evaluations of the eletrophotographic characteristics.

EXAMPLE 3

A photoconductive layer and a surface layer were deposited on an aluminum cylinder, which had been mirror-finished, by using the producing apparatus shown in FIGS. 5 and 6 and the photoconductive layer comprising a plurality of layers which each have a constant carbon atom content were deposited in tiers (four layers in this case), and a light-receiving member for electrophotography in which the distribution of the carbon atom content was varied in a cascade was produced. In this case, the boron atom content is determined in accordance with the carbon atom content for each layer according to the equation 1.

Table 12 shows the producing conditions.

The light-receiving member produced in Example 3 was evaluated as in Example 1. Table 14 shows the results of evaluations of the eletrophotographic characteristics.

The cascaded variation of the distribution of the carbon content as in Example 3 remarkably facilitates the control of gas flow rates for the producing apparatus and a complex control system using a computer is not required. Accordingly, there is advantageous in that the costs of the apparatus can be reduced and film formation can be easily controlled since a plasma state in the film can be maintained in a semi-stable state for a relatively long period of time.

EXAMPLE 4

When a photoconductive layer and a surface layer are deposited on an aluminum cylinder, which have been mirror-finished, by using the producing apparatus shown in FIGS. 5 and 6 and small quantities of oxygen atoms and fluorine atoms are contained in the photoconductive layer, another equation of relation should be derived according to the experiment.

A correlation of carbon atoms and boron atoms in the case that oxygen atoms and fluorine atoms are contained in the photoconductive layer is as given below:

$$Y_1 = \text{EXP}\left[\frac{X_1 - F}{E}\right] \quad (3)$$

where $X_1$ is the atomic % of carbon atoms contained, $Y_1$ is the atomic ppm of boron atoms, and E and F are constants. $E=2.7\pm0.5$ and $F=2.1\pm0.6$ were obtained.

When the same light-receiving member as in Examples 1 to 3 was produced according to the correlation given by the equation 3 and the electrophotographic characteristics were evaluated in the same manner as in Example 1, satisfactory results were obtained as in Examples 1 to 3. The producing conditions are as shown in Tables 14, 15 and 16. The results of evaluations are as shown in Table 17.

In this case of producing a light-receiving member which has a photoconductive layer having hydrogenated amorphous silicon which contains carbon atoms, boron atoms, oxygen atoms and fluorine atoms by the CVD method, it is preferable to determine a charge $Y_4$ of a starting gas for the boron atoms for a charge $X_4$ of a starting gas for the carbon atoms in terms of exponential functions as given below:

$$Y_4 = \text{EXP}\left[\frac{X_4 + H}{G}\right] \quad (4)$$

where G and H are constants. In this case, it is preferable to determine G as $4.9\pm0.7$ and H as $1.5\pm0.4$.

EXAMPLE 5

A light-receiving member was produced on an aluminum cylinder, which had been mirror-finished, by using the producing apparatus shown in FIGS. 5 and 6 and employing the photoconductive layer described in Examples 1 to 4 in the light-receiving member for electrophotography which comprises three layers, that is, a charge injection blocking layer, a photoconductive layer and a surface layer. The same evaluations as in Example 1 were conducted and satisfactory results were obtained as in Examples 1 to 4.

The producing conditions are as shown in Table 18. The results of evaluations are as shown in Table 19.

EXAMPLE 6

A photoconductive layer and a surface layer are deposited on an aluminum cylinder, which is mirror-finished, by using the producing apparatus shown in FIGS. 5 and 6 and the photoconductive layer is produced according to the equation 1 derived from the experiment. The carbon atom content decreases toward the surface in the direction of film thickness in terms of linear functions. Accordingly, the sample (sample 6) was produced so that the boron atom content decreased in terms of exponential functions according to the equation 1. In this case, the sample was produced so that the boron atom content for the carbon atom content remains within the allowable range (+40% to −20%). The producing conditions are as shown in Table 20. For comparison, a photoconductive layer and a surface layer were deposited on an aluminum cylinder, which was mirror-finished, and the sample (sample 7) was produced so that the boron atom content for the carbon atom content remained out of the allowable range (+40% to −20%). The producing conditions are as shown in Table 21.

The light-receiving member thus produced was set on an electrophotographic unit (which was modified for this test from the NP6650 manufactured by CANON) and the electrophotographic characteristics such as the charge performance, sensitivity, residual potential, optical memory and image defect were evaluated.

The results of evaluations of the electrophotographic characteristics are as shown in Table 22.

The following conclusion was derived from the results of the above Examples.

(1) As shown in Table 25, if the carbon atom content in the above-described photoconductive layer for the silicon atoms is smaller than 0.005 atomic %, adhesiveness will be unsatisfactory and exfoliation of the film and image defects will often occur. If the carbon atom content is larger than 20 atomic %, the film will tend to have a higher resistance and the residual potential will increase. Moreover, the transitivity of the hole substantially reduces and therefore the sensitivity will deteriorate.

The boron atom content also varies as well as the carbon atom content. If the boron atom content for silicon atoms is smaller than 0.01 atomic ppm, the charge performance is low and the optical memory becomes large and therefore an excellent light-receiving member according to the present invention cannot be obtained. If the boron atom content is larger than 15 atomic ppm, the activating energy is reduced by boron atoms and the charge performance becomes small.

Hydrogen atoms serve to relieve a structural strain of hydrogenated amorphous silicon and compensation of dangling bond. If hydrogen atoms contained reduces, a dangling bond increases to cause larger structural strain and deteriorate adhesives and photoconductivity. If hydrogen atoms increase, they cohere in the film to cause the film to be brittle.

(2) As shown in Table 26, the boron atom content in the photoconductive layer varies in the correlation of exponential function to the carbon atom content in the photoconductive layer and the boron atoms are contained in the photoconductive layer in the range of from −25% to +45%, maximum, as the exponential function value determined from the carbon atom content and therefore excellent light-receiving members for electrophotography to be provided by the present invention can be obtained.

TABLE 1

| Producing condition | Layer structure | | | |
|---|---|---|---|---|
| | Blocking layer | Photo-conductive layer 1 | Photo-conductive layer 2 | Surface layer |
| Starting gas flow rate | | | | |
| $SiH_4$ | 400 sccm | 300 sccm | 300 sccm | 100 sccm |
| $CH_4$ | 150 sccm | * sccm | 0 sccm | 400 sccm |
| He | 2000 sccm | 2000 sccm | 3500 sccm | 3500 sccm |
| $B_2H_6/SiH_4$ | 0 sccm | * sccm | 0 sccm | 0 sccm |
| $H_2$ | 1000 sccm | 1600 sccm | 0 sccm | 0 sccm |
| Internal pressure | 12 mtorr | 12 mtorr | 12 mtorr | 15 mtorr |
| Microwave power | 300 W | 300 W | 300 W | 300 W |
| Bias voltage | 60 V | 60 V | 60 V | 60 V |
| Layer thickness | 3 μm | 24 μm | 2 μm | 0.5 μm |

*shown in Table 2.

TABLE 2

| | Sample | | | | | | | | | | | | | | | |
|---|---|---|---|---|---|---|---|---|---|---|---|---|---|---|---|---|
| Charge of Starting gas | A0 | A1 | A2 | A3 | B1 | B2 | B3 | C1 | C2 | C3 | D1 | D2 | D3 | E1 | E2 | E3 |
| $CH_4/SiH_4$ (%) | 0 | 0 | 0 | 0 | 10 | 10 | 10 | 20 | 20 | 20 | 30 | 30 | 30 | 40 | 40 | 40 |
| $B_2H_6/SiH_4$ (ppm) | 0.4 | 0.5 | 0.6 | 0.7 | 3 | 3.5 | 4 | 5 | 6 | 7 | 12 | 14 | 16 | 20 | 25 | 30 |

Effect of the Invention

As described in detail, the present invention provides an effect that the boron atom content in the photoconductive layer of the light-receiving member can be determined in the correlation of exponential function according to the present invention with respect to the carbon atom content in the above-described photoconductive layer to eliminate labor and time for experimentally determining respective contents with a number of samples produced as in the related art and therefore the layer structure can be designed more surely and easily.

Extremely excellent electrical and optical characteristics including the charge holding performance for treating the charge of the light-receiving members and durability, which are totally improved, can be obtained.

In addition, the present invention renders another effect to provide a method for producing a light-receiving member based on such layer design according to the present invention, the method being adapted to stably and easily produce a light-receiving member having a desired design of layer structure by forming the film while controlling the charge of the starting gas for boron atoms in the correlation of exponential function according to the present invention to the charge of the starting gas for carbon atoms.

TABLE 3

| | Evaluation item | | | | |
|---|---|---|---|---|---|
| Sample | Charge performance | Sensitivity | Dark decay | Residual potential | Optical memory |
| A0 | + | ○ | + | − | − |
| A1 | ○ | ○ | ○ | ○ | ○ |
| A2 | − | − | − | + | + |
| A3 | — | — | — | + | + |
| B1 | + | − | + | − | − |
| B2 | + | = | = | = | = |
| B3 | − | − | − | + | + |
| C1 | + | − | + | — | − |
| C2 | + | = | + | − | − |
| C3 | + | + | = | = | + |
| D1 | + | + | − | − | + |
| D2 | = | = | = | = | ++ |
| D3 | − | − | + | + | ++ |
| E1 | + | + | − | − | + |
| E2 | − | = | = | = | ++ |
| E3 | — | − | + | + | ++ |

○ (A1) Satisfies excellent electrophotographic characteristics
+ . . . Good, ++ . . . Better
= . . . Equivalent
− . . . Bad, — . . . Worse

TABLE 4

| Producing condition | Layer structure | | | Surface layer |
|---|---|---|---|---|
| | Photoconductive layer | | | |
| | Substrate side | | Surface side | |
| Starting gas flow rate | | | | |
| $SiH_4$ | 300 sccm | → | 250 sccm | 100 sccm |
| He | 2000 sccm | → | 4000 sccm | 3500 sccm |
| $H_2$ | 1500 sccm | → | 0 sccm | 0 sccm |
| $CH_4/SiH_4$* | 7% | → | 0% | 400 sccm |
| $B_2H_6/SiH_4$* | Conforms to the equation 1. | | | 0 sccm |
| Internal pressure | 12 mtorr | → | 15 mtorr | 15 mtorr |
| Microwave power | 300 W | → | 350 W | 300 W |
| Bias voltage | | 70 V | | 90 V |
| Layer thickness | | 27 μm | | 0.5 μm |

*$CH_4/SiH_4$ and $B_2H_6/SiH_4$ are given the values calculated from the correlation of the charges and the contents.

TABLE 5

| Producing condition | Layer structure | | | Surface layer |
|---|---|---|---|---|
| | Photoconductive layer | | | |
| | Substrate side | | Surface side | |
| Starting gas flow rate | | | | |
| $SiH_4$ | 300 sccm | → | 250 sccm | 100 sccm |
| He | 2000 sccm | → | 4000 sccm | 3500 sccm |
| $H_2$ | 1500 sccm | → | 0 sccm | 0 sccm |
| $CH_4/SiH_4$* | 7% | → | 0% | 400 sccm |
| $B_2H_6/SiH_4$* | The value of 7% conforms to the equation 1 and subsequently varies in a linear mode. | | | 0 sccm |
| Internal pressure | 12 mtorr | → | 15 mtorr | 15 mtorr |
| Microwave power | 300 W | → | 350 W | 300 W |
| Bias voltage | | 70 V | | 90 V |
| Layer thickness | | 27 μm | | 0.5 μm |

*$CH_4/SiH_4$ and $B_2H_6/SiH_4$ are given the values calculated from the correlation of the charges and the contents.

TABLE 6

| Sample | Evaluation item | | | | | | |
|---|---|---|---|---|---|---|---|
| | Charge performance | Sensitivity | Dark decay | Residual potential | Optical memory | Image smear | Adhesiveness |
| Sample 1 | ++ | ++ | ++ | + | + | + | ++ |
| Sample 2 | − | = | = | + | = | + | ++ |

++ ... Excellent
+ ... Good
= ... Practical
− ... Available for practical use
— ... Unpractical

TABLE 7

| Producing condition | Layer structure | | | Surface layer |
|---|---|---|---|---|
| | Photoconductive layer | | | |
| | Substrate side | | Surface side | |
| Starting gas flow rate | | | | |
| $SiH_4$ | 300 sccm | → | 250 sccm | 100 sccm |
| He | 2000 sccm | → | 4000 sccm | 3500 sccm |
| $H_2$ | 1500 sccm | → | 0 sccm | 0 sccm |
| $CH_4/SiH_4$* | Shown in Table 8 | | | 400 sccm |
| $B_2H_6/SiH_4$* | Conforms to the equation 1. | | | 0 sccm |
| Internal pressure | 11 mtorr | → | 14 mtorr | 15 mtorr |
| Microwave power | 300 W | → | 350 W | 300 W |
| Bias voltage | | 70 V | | 90 V |
| Layer thickness | | 27 μm | | 0.5 μm |

*$CH_4/SiH_4$ and $B_2H_6/SiH_4$ are given the values calculated from the correlation of the charges and the contents.

TABLE 8

| Sample 2-A | $CH_4/SiH_4$ | 1% → 8% |
| Sample 2-B | $CH_4/SiH_4$ | 5% → 5% |
| Sample 2-C | $CH_4/SiH_4$ | 7% → 0% |

*$CH_4/SiH_4$ and $B_2H_6/SiH_4$ are given the values calculated from the correlation of the charges and the contents.

TABLE 9

| Sample | Evaluation item | | | | | | |
|---|---|---|---|---|---|---|---|
| | Charge performance | Sensitivity | Dark decay | Residual potential | Optical memory | Image smear | Adhesiveness |
| Sample 2-A | + | = | + | = | = | + | = |
| Sample 2-B | + | + | + | = | + | + | + |
| Sample 2-C | ++ | ++ | ++ | + | + | + | ++ |

++ ... Excellent
+ ... Good
= ... Practical
− ... Available for practical use
— ... Unpractical

TABLE 10

| Producing condition | Layer structure | | | Surface layer |
|---|---|---|---|---|
| | Photoconductive layer | | | |
| | Substrate side | | Surface side | |
| Starting gas flow rate | | | | |
| $SiH_4$ | 300 sccm | → | 250 sccm | 100 sccm |
| He | 2000 sccm | → | 4000 sccm | 3500 sccm |
| $H_2$ | 1500 sccm | → | 0 sccm | 0 sccm |
| $CH_4/SiH_4$* | 6% | → | 0% | 400 sccm |
| $B_2H_6/SiH_4$* | 1.5 ppm → 1 ppm → 0.6 ppm | | | 0 sccm |

TABLE 10-continued

| | Layer structure | | |
|---|---|---|---|
| | Photoconductive layer | | |
| Producing condition | Substrate side | Surface side | Surface layer |
| Internal pressure | 12 mtorr → | 15 mtorr | 15 mtorr |
| Microwave power | 300 W → | 350 W | 300 W |
| Bias voltage | 70 V | | 90 V |
| Layer thickness | 27 μm | | 0.5 μm |

*$CH_4/SiH_4$ and $B_2H_6/SiH_4$ are given the values calculated from the correlation of the charges and the contents.

TABLE 11

| Sample | Charge performance | Sensitivity | Dark decay | Residual potential | Optical memory | Image smear | Adhesiveness |
|---|---|---|---|---|---|---|---|
| Example 2 | ++ | ++ | ++ | + | + | + | ++ |

++ ... Excellent
+ ... Good
= ... Practical
− ... Available for practical use
— ... Unpractical

TABLE 12

| | Layer structure | | | | | |
|---|---|---|---|---|---|---|
| | Photoconductive layer | | | | | |
| Producing condition | Substrate side | | | Surface side | | Surface layer |
| Starting gas flow rate | | | | | | |
| $SiH_4$ | 300 sccm | 280 sccm | 260 sccm | 250 sccm | | 100 sccm |
| He | 2000 sccm | 2700 sccm | 3400 sccm | 4000 sccm | | 3500 sccm |
| $H_2$ | 1500 sccm | 1000 sccm | 500 sccm | 0 sccm | | 0 sccm |
| $CH_4/SiH_4$* | 6% | 4% | 2% | 0% | | 400 sccm |
| $B_2H_6/SiH_4$* | | Conforms to the equation 1. | | | | 0 sccm |
| Internal pressure | | 12 mtorr | | | | 15 mtorr |
| Microwave power | | 300 W | | | | 300 W |
| Bias voltage | | 70 V | | | | 90 V |
| Layer thickness | | 27 μm | | | | 0.5 μm |

*$CH_4/SiH_4$ and $B_2H_6/SiH_4$ are given the values calculated from the correlation of the charges and the contents.

TABLE 13

| Sample | Charge performance | Sensitivity | Dark decay | Residual potential | Optical memory | Image smear | Adhesiveness |
|---|---|---|---|---|---|---|---|
| Example 3 | ++ | ++ | ++ | + | ++ | + | ++ |

++ ... Excellent
+ ... Good
= ... Practical
− ... Available for practical use
— ... Unpractical

TABLE 14

Sample 4-A

| | Layer structure | | |
|---|---|---|---|
| | Photoconductive layer | | |
| Producing condition | Substrate side | Surface side | Surface layer |
| Starting gas flow rate | | | |
| $SiH_4$ | 300 sccm → | 250 sccm | 100 sccm |
| He | 2000 sccm → | 4000 sccm | 3500 sccm |
| $H_2$ | 1500 sccm → | 0 sccm | 0 sccm |
| $CH_4/SiH_4$* | 6% → | 0% | 400 sccm |
| $B_2H_6/SiH_4$* | Conforms to the equation 2. | | 0 sccm |
| $SiF_4$ | 100 ppm | | |
| $CO_2$ | 1000 ppm | | |
| Internal pressure | 13 mTorr → | 16 mTorr | 15 mTorr |
| Microwave power | 300 W → | 350 W | 300 W |
| Bias voltage | 70 V | | 90 V |
| Layer thickness | 27 μm | | 0.5 μm |

TABLE 14-continued

Sample 4-A

Layer structure

| Producing condition | Photoconductive layer | | Surface layer |
|---|---|---|---|
| | Substrate side | Surface side | |

*$CH_4/SiH_4$ and $B_2H_6/SiH_4$ are given the values calculated from the correlation of the charges and the contents.

TABLE 15

Sample 4-B

Layer structure

| Producing condition | Photoconductive layer | | Surface layer |
|---|---|---|---|
| | Substrate side | Surface side | |
| Starting gas flow rate | | | |
| $SiH_4$ | 300 sccm → | 250 sccm | 100 sccm |
| He | 2000 sccm → | 4000 sccm | 3500 sccm |
| $H_2$ | 1500 sccm → | 0 sccm | 0 sccm |
| $CH_4/SiH_4$* | 6% → | 0% | 400 sccm |
| $B_2H_6/SiH_4$* | 1.5 ppm → 1 ppm → 0.6 ppm | | 0 sccm |
| $SiF_4$ | 100 ppm | | |
| $CO_2$ | 1000 ppm | | |
| Internal pressure | 12 mTorr → | 15 mTorr | 15 mTorr |
| Microwave power | 300 W → | 350 W | 300 W |
| Bias voltage | 70 V | | 90 V |
| Layer thickness | 27 μm | | 0.5 μm |

*$CH_4/SiH_4$ and $B_2H_6/SiH_4$ are given the values calculated from the correlation of the charges and the contents.

TABLE 16

Sample 4-C

Layer structure

| Producing condition | Photoconductive layer | | | | Surface layer |
|---|---|---|---|---|---|
| | Substrate side | | | Surface side | |
| Starting gas flow rate | | | | | |
| $SiH_4$ | 300 sccm | 280 sccm | 260 sccm | 250 sccm | 100 sccm |
| He | 2000 sccm | 2700 sccm | 3400 sccm | 4000 sccm | 3500 sccm |
| $H_2$ | 1500 sccm | 1000 sccm | 500 sccm | 0 sccm | 0 sccm |
| $CH_4/SiH_4$* | 6% | 4% | 2% | 0% | 400 sccm |
| $B_2H_6/SiH_4$* | Conforms to the equation 1. | | | | 0 sccm |
| $SiF_4$ | 100 ppm | | | | |
| $CO_2$ | 1000 ppm | | | | |
| Internal pressure | 12 mTorr | | | | 15 mTorr |
| Microwave power | 300 W | | | | 300 W |
| Bias voltage | 70 V | | | | 90 V |
| Layer thickness | 27 μm | | | | 0.5 μm |

*$CH_4/SiH_4$ and $B_2H_6/SiH_4$ are given the values calculated from the correlation of the charges and the contents.

TABLE 17

| | Evaluation item | | | | | | |
|---|---|---|---|---|---|---|---|
| Sample | Charge performance | Sensitivity | Dark decay | Residual potential | Optical memory | Image smear | Adhesiveness |
| Sample 4-A | ++ | ++ | ++ | + | + | ++ | ++ |
| Sample 4-B | ++ | ++ | ++ | + | + | ++ | ++ |
| Sample 4-C | ++ | ++ | ++ | + | + | ++ | ++ |

++ ... Excellent
+ ... Good
= ... Practical
− ... Available for practical use
— ... Unpractical

TABLE 18

| Producing condition | Layer structure Charge injection blocking layer |
|---|---|
| Starting gas flow rate | |
| $SiH_4$ | 400 sccm |
| He | 2000 sccm |
| $H_2$ | 1000 sccm |
| $CH_4/SiH_4$* | 20% |
| $B_2H_6/SiH_4$* | 15 ppm |
| Internal pressure | 8 mTorr |
| Microwave power | 300 W |
| Bias voltage | 70 V |
| Layer thickness | 3 μm |
| Sample 5-A = | Photoconductive layer and |

TABLE 18-continued

| Producing condition | Layer structure Charge injection blocking layer |
|---|---|
| Sample 5-B = | surface layer of Example 1 Photoconductive layer and surface layer of Example 2 |
| Sample 5-C = | Photoconductive layer and surface layer of Example 3 |
| Sample 5-DA = | Photoconductive layer and surface layer of Example 4-A |
| Sample 5-DB = | Photoconductive layer and surface layer of Example 4-B |
| Sample 5-DC = | Photoconductive layer and surface layer of Example 4-C |

*$CH_4/SiH_4$ and $B_2H_6/SiH_4$ are given the values calculated from the correlation of the charges and the contents.

TABLE 19

| | Evaluation item | | | | | | |
|---|---|---|---|---|---|---|---|
| Sample | Charge performance | Sensitivity | Dark decay | Residual potential | Optical memory | Image smear | Adhesiveness |
| Sample 5-A | + | = | + | + | = | = | + |
| Sample 5-B | + | = | + | + | = | = | + |
| Sample 5-C | + | = | + | + | = | = | + |
| Sample 5-DA | + | = | + | + | = | + | + |
| Sample 5-DB | + | = | + | + | = | + | + |
| Sample 5-DC | + | = | + | + | = | + | + |

5-A is compared with Example 1, 5-B with Example 2, 5-C with Example 3, and 5-DA, 5-DB and 5-DC with Example 4.
+ . . . Good, ++ . . . Better
= . . . Equivalent
− . . . Bad, — . . . Worse

TABLE 20

| | Layer structure | | | |
|---|---|---|---|---|
| | Photoconductive layer | | | |
| Producing condition | Substrate side | | Surface side | Surface layer |
| Starting gas flow rate | | | | |
| $SiH_4$ | 300 sccm | → | 250 sccm | 100 sccm |
| He | 2000 sccm | → | 4000 sccm | 3500 sccm |
| $H_2$ | 1500 sccm | → | 0 sccm | 0 sccm |
| $CH_4/SiH_4$* | 7% | → | 0% | 400 sccm |
| $B_2H_6/SiH_4$ | Shown in Table 21 | | | 0 sccm |
| Internal pressure | 12 mTorr | → | 15 mTorr | 15 mTorr |
| Microwave power | 300 W | → | 350 W | 300 W |
| Bias voltage | | 70 V | | 90 V |
| Layer thickness | | 27 μm | | 0.5 μm |

*$CH_4/SiH_4$ is given the value calculated from the correlation of the charge and the content.

TABLE 21

| | Starting gas $B_2H_6/SiH_4$ (ppm) |
|---|---|
| Sample 6-A | 1.55 → 0.8 → 0.46 (+10%) |
| Sample 6-B | 1.40 → 0.8 → 0.52 (+13%) |

TABLE 21-continued

| | Starting gas $B_2H_6/SiH_4$ (ppm) |
|---|---|
| Sample 6-C | 1.27 → 0.8 → 0.40 (−10%) (−13%) |
| Sample 7-A | 2.2 → 0.7 → 0.46 (+57%) |
| Sample 7-B | 1.40 → 0.7 → 0.6 (+43%) |
| Sample 7-C | 1.00 → 0.7 → 0.46 (−28%) |

*$B_2H_6/SiH_4$ is given the values calculated from the correlation of the charge and the content.

TABLE 22

| | Evaluation item | | | | | | |
|---|---|---|---|---|---|---|---|
| Sample | Charge performance | Sensitivity | Dark decay | Residual potential | Optical memory | Image smear | Adhesiveness |
| Sample 6-A | + | = | + | ++ | + | = | ++ |
| Sample 6-B | + | + | = | + | + | = | + |
| Sample 6-C | ++ | = | + | = | = | = | + |
| Sample 7-A | − | = | − | + | + | + | ++ |
| Sample 7-B | − | = | − | + | = | = | + |
| Sample 7-C | + | = | + | − | − | + | = |

+ . . . Good, ++ . . . Better
= . . . Equivalent
− . . . Bad, — . . . Worse

TABLE 23

| | $CH_4/SiH_4$ (%) | $B_2H_6/SiH_4$ (ppm) |
|---|---|---|
| 3A (1) | 0 | Equation 1 |
| 3A (2) | 0.005 | Equation 1 |
| 3A (3) | 10 | Equation 1 |

TABLE 23-continued

| | $CH_4/SiH_4$ (%) | $B_2H_6/SiH_4$ (ppm) |
|---|---|---|
| 3A (4) | 20 | Equation 1 |
| 3A (5) | 25 | Equation 1 |
| 3B (1) | 10 | 0 |
| 3B (2) | 10 | 0.01 |
| 3B (3) | 10 | 10 |
| 3B (4) | 10 | 15 |
| 3B (5) | 10 | 20 |

TABLE 24

| | Charge performance | Sensitivity | Dark decay | Residual potential | Optical memory | Hydrogen content |
|---|---|---|---|---|---|---|
| 3A (1) | ○ | ⊙ | △ | ○ | △ | 28% |
| 3A (2) | ⊙ | ⊙ | ⊙ | ○ | △ | 15% |
| 3A (3) | ⊙ | ⊙ | ⊙ | ⊙ | △ | 14% |
| 3A (4) | ⊙ | ○ | ⊙ | ○ | ○ | 16% |
| 3A (5) | △ | △ | ○ | ○ | ○ | 19% |
| 3B (1) | ⊙ | ○ | ⊙ | ⊙ | △ | 16% |
| 3B (2) | ⊙ | ○ | ○ | ⊙ | △ | 15% |
| 3B (3) | ⊙ | ⊙ | ○ | ○ | ○ | 19% |
| 3B (4) | ○ | ○ | △ | ○ | ○ | 13% |
| 3B (5) | △ | ○ | △ | △ | ⊙ | 17% |

⊙ ... Good
○ ... Practical
△ ... Available for practical use
X ... Unpractical

TABLE 25

| Sample | Quantity of $SiH_4$ (SCCM) | $CH_4/SiH_4$ (atomic %) | $B_2H_6/SiH_4$ (atomic ppm) | Charge performance | Sensitivity | Dark decay | Residual potential | Optical memory | Image defect | Adhesiveness |
|---|---|---|---|---|---|---|---|---|---|---|
| A-A | 300 | 0.001 | Equation 1 | △ | ○ | ○ | ○ | △ | △ | △ |
| A-B | ↑ | 0.005 | Equation 1 | ○ | ⊙ | ○ | ○ | ○ | △ | △ |
| A-C | ↑ | 5 | Equation 1 | ⊙ | ⊙ | ⊙ | ○ | ○ | ○ | ○ |
| A-D | ↑ | 20 | Equation 1 | ⊙ | ○ | ○ | △ | △ | ○ | ○ |
| A-E | ↑ | 50 | Equation 1 | ⊙ | △ | ○ | △ | △ | ○ | ○ |
| B-A | ↑ | 0.005 | 0.005 | △ | △ | ○ | △ | △ | △ | △ |
| B-B | ↑ | 0.005 | 0.01 | △ | ○ | ○ | ○ | △ | △ | △ |
| B-C | ↑ | 0.005 | 15 | △ | ○ | △ | ○ | ○ | △ | △ |
| B-D | ↑ | 0.005 | 20 | △ | ○ | △ | ○ | ○ | △ | △ |
| C-A | ↑ | 5 | 0.005 | ○ | ○ | ○ | ○ | △ | ○ | ○ |
| C-B | ↑ | 5 | 0.01 | ○ | ○ | ○ | △ | △ | ○ | ○ |
| C-C | ↑ | 5 | 15 | △ | ○ | △ | ○ | ⊙ | ○ | ○ |
| C-D | ↑ | 5 | 20 | △ | △ | △ | ⊙ | ⊙ | ○ | ○ |
| D-A | ↑ | 20 | 0.005 | ⊙ | △ | ○ | △ | △ | ○ | ○ |
| D-B | ↑ | 20 | 0.01 | ⊙ | △ | ○ | △ | △ | ○ | ○ |
| D-C | ↑ | 20 | 15 | ⊙ | ⊙ | ⊙ | ○ | ○ | ○ | ○ |
| D-D | ↑ | 20 | 20 | ○ | ○ | ○ | ○ | ⊙ | ○ | ○ |

TABLE 26

| Sample | Quantity of $SiH_4$ (SCCM) | $CH_4/SiH_4$ (atomic %) | $B_2H_6/SiH_4$ (atomic ppm) | Charge performance | Sensitivity | Dark decay | Residual potential | Optical memory | Image defect | Adhesiveness |
|---|---|---|---|---|---|---|---|---|---|---|
| E-A | 300 | 1 | −28% (0.35) | ○ | △ | ○ | △ | △ | ○ | ○ |
| E-B | ↑ | 1 | −25% (0.37) | ○ | △ | ○ | △ | △ | ○ | ○ |
| E-C | ↑ | 1 | Equation 1 (0.49) | ○ | ○ | ○ | ○ | ○ | ○ | ○ |
| E-D | ↑ | 1 | +45% (0.71) | △ | ○ | △ | ○ | ⊙ | ○ | ○ |

TABLE 26-continued

| Sample | Quantity of SiH₄ (SCCM) | CH₄/SiH₄ (atomic %) | B₂H₆/SiH₄ (atomic ppm) | Charge performance | Sensitivity | Dark decay | Residual potential | Optical memory | Image defect | Adhesiveness |
|---|---|---|---|---|---|---|---|---|---|---|
| E-E | ↑ | 1 | +50% (0.73) | Δ | O | Δ | O | ⊙ | O | O |
| F-A | ↑ | 10 | −28% (1.5) | ⊙ | Δ | O | Δ | Δ | O | O |
| F-B | ↑ | 10 | −25% (1.6) | ⊙ | Δ | O | Δ | Δ | O | O |
| F-C | ↑ | 10 | Equation 1 (2.1) | ⊙ | ⊙ | ⊙ | O | O | O | O |
| F-D | ↑ | 10 | +45% (3.0) | O | ⊙ | Δ | O | O | O | O |
| F-E | ↑ | 10 | +52% (3.2) | Δ | O | Δ | O | ⊙ | O | O |
| G-A | ↑ | 20 | −28% (7.5) | ⊙ | O | O | Δ | Δ | ⊙ | ⊙ |
| G-B | ↑ | 20 | −25% (7.88) | ⊙ | O | O | O | Δ | ⊙ | ⊙ |
| G-C | ↑ | 20 | Equation 1 (10.5) | ⊙ | O | O | ⊙ | O | ⊙ | ⊙ |
| G-D | ↑ | 20 | +45% (15.2) | O | Δ | Δ | ⊙ | O | ⊙ | ⊙ |
| G-E | ↑ | 20 | +47% (15.5) | O | Δ | Δ | ⊙ | O | ⊙ | ⊙ |

What is claimed is:

1. A light-receiving member comprising a photoconductive layer having a non-monocrystalline material comprising silicon atoms as a main element and a surface layer formed in this order on a substrate having at least a conductive surface, wherein said photoconductive layer comprises hydrogenated amorphous silicon containing at least carbon atoms and boron atoms and a correlation between a carbon atom content (X) and a boron atom content (Y) in a direction of film thickness in said photoconductive layer has a relationship of exponential functions.

2. The light-receiving member according to claim 1, wherein said relationship of exponential functions is as given in equation (1):

$$Y = \mathrm{EXP}\left[\frac{X+B}{A}\right] \quad (1)$$

where A and B are constants.

3. The light-receiving member according to claim 2, wherein the constants A and B of said equation (1) are A=6.2±0.5 and B=−5.4±0.9, respectively.

4. The light-receiving member according to claim 1, wherein a distribution of carbon atoms contained in said photoconductive layer in a direction of film thickness varies stepwise.

5. The light-receiving member according to claim 1, wherein a distribution of carbon atoms contained in said photoconductive layer in a direction of film thickness varies continuously.

6. The light-receiving member according to claim 1, wherein a distribution of carbon atoms contained in said photoconductive layer in a direction of film thickness concentrates at said conductive substrate side.

7. The light-receiving member according to claim 1, wherein a carbon atom content in said photoconductive layer is 0.005 atomic % to 20 atomic % as a mean value of said photoconductive layer with respect to silicon atoms, a boron atom content is 0.01 atomic ppm to 15 atomic ppm with respect to said silicon atoms, and a hydrogen atom content is 5 atomic % to 30 atomic % with respect to said silicon atoms.

8. The light-receiving member according to claim 1, wherein a distribution of boron atoms contained in said photoconductive layer varies in a correlation of exponential functions with respect to said distribution of carbon atoms in the photoconductive layer and said boron atoms are distributed in a range of +45% to −25% of a value of exponential function determined from said carbon atom content.

9. The light-receiving member according to claim 1, wherein said photoconductive layer comprises hydrogenated amorphous silicon which contains oxygen atoms and fluorine atoms in addition to said carbon atoms and said boron atoms.

10. The light-receiving member according to claim 9, wherein a correlation between said carbon atom content $X_1$ atomic % of carbon atoms and said boron atom content $Y_1$ atomic ppm of boron atoms, which are contained in said photoconductive layer, is given in a relationship of exponential functions as below:

$$Y_1 = \mathrm{EXP}\left[\frac{X_1 - F}{E}\right]$$

where E and F are constants.

11. The light-receiving member according to claim 10, wherein said constants are E=2.7±0.5 and F=2.1±0.6, respectively.

12. A method for producing a light-receiving member comprising a photoconductive layer which comprises hydrogenated amorphous silicon containing carbon atoms and boron atoms by a CVD method, wherein said layer is formed by controlling a charge of a starting gas for said boron atoms with respect to a charge of a starting gas for said carbon atoms so that they have a correlation of exponential functions as given in equation (2):

$$Y_2 = \mathrm{EXP}\left[\frac{X_2 - D}{C}\right] \quad (2)$$

where $X_2$ is a starting gas charge for said carbon atoms, $Y_2$ is a starting gas charge for said boron atoms, and C and D are constants.

13. A method for producing a light-receiving member according to claim 12, wherein constants C and D of said equation (2) are C=36±3 and D=29±7, respectively.

* * * * *